(12) United States Patent
Minami et al.

(10) Patent No.: US 8,728,356 B2
(45) Date of Patent: May 20, 2014

(54) COMPOSITE THERMOELECTRIC MATERIAL AND METHOD FOR PRODUCING THE SAME

(75) Inventors: Hideki Minami, Tokyo (JP); Yuji Hiroshige, Tokyo (JP)

(73) Assignee: 3M Innovative Properties Company, St. Paul, MN (US)

( * ) Notice: Subject to any disclaimer, the term of this patent is extended or adjusted under 35 U.S.C. 154(b) by 476 days.

(21) Appl. No.: 13/262,845

(22) PCT Filed: Apr. 1, 2010

(86) PCT No.: PCT/US2010/029632
§ 371 (c)(1),
(2), (4) Date: Oct. 4, 2011

(87) PCT Pub. No.: WO2010/117875
PCT Pub. Date: Oct. 14, 2010

(65) Prior Publication Data
US 2012/0018682 A1 Jan. 26, 2012

(30) Foreign Application Priority Data

Apr. 6, 2009 (JP) ................................. 2009-092507

(51) Int. Cl.
| H01B 1/02 | (2006.01) |
| H01L 35/00 | (2006.01) |
| B22F 1/02 | (2006.01) |
| B22F 1/00 | (2006.01) |
| B22F 9/24 | (2006.01) |
| H01L 35/14 | (2006.01) |
| H01L 35/34 | (2006.01) |

(52) U.S. Cl.
CPC .............. B22F 1/025 (2013.01); B22F 1/0018 (2013.01); B22F 1/0044 (2013.01); B22F 9/24 (2013.01); H01L 35/14 (2013.01); H01L 35/34 (2013.01)
USPC .......................................... 252/514; 136/200

(58) Field of Classification Search
None
See application file for complete search history.

(56) References Cited

U.S. PATENT DOCUMENTS

| 6,225,548 B1 | 5/2001 | Sakakibara |
| 6,710,238 B1 | 3/2004 | Shingu |
| 7,259,320 B2 * | 8/2007 | Take .......................... 136/236.1 |
| 8,394,284 B2 * | 3/2013 | Murai et al. ............... 252/62.3 T |
| 8,518,288 B2 * | 8/2013 | Rowe ........................ 252/62.3 T |
| 2004/0045402 A1 | 3/2004 | Boily |
| 2008/0087314 A1* | 4/2008 | Xiao et al. .................... 136/201 |

FOREIGN PATENT DOCUMENTS

| JP | 3910318 B2 | 3/2001 |
| JP | 2004-531644 | 10/2004 |

OTHER PUBLICATIONS

Ohtaki, "High-Temperature Thermoelectric Properties of $(Zn_{1-x}Al_x)O$", J. Appl. Phys., Feb. 1, 1996, vol. 79, No. 3, pp. 1816-1818.

Ohtaki, "Enhanced Thermoelectric Performance of ZnO-based Oxide Materials", Trans. Mater. Res. Soc. Jpn., 2004, vol. 29, No. 6, pp. 2727-2730.

International Search Report for PCT/US2010/029632, 3 pages.

* cited by examiner

*Primary Examiner* — Harold Pyon
*Assistant Examiner* — Jaison Thomas
(74) *Attorney, Agent, or Firm* — Jean A. Lown; Steven E. Skolnick

(57) ABSTRACT

The present disclosure provides a thermoelectric material which can be formed into a flexible and thin type material. The thermoelectric material is a composite that includes a binder resin, thermoelectric material particles dispersed in the binder resin, and fine metal particles supported on a surface of the thermoelectric material particles.

12 Claims, 2 Drawing Sheets

COMPOSITE THERMOELECTRIC MATERIAL AND METHOD FOR PRODUCING THE SAME

CROSS REFERENCE TO RELATED APPLICATIONS

This application is a national stage filing under 35 U.S.C. 371 of PCT/US2010/029632 filed Apr. 1, 2010, which claims priority to Japanese Application No. 2009-092507, filed Apr. 6, 2009, the disclosures of which are incorporated by reference in their entirety herein.

TECHNICAL FIELD

The present disclosure relates to a composite thermoelectric material and a method for producing the same.

BACKGROUND ART

Telluride-based materials have been used as thermoelectric materials at temperatures close to room temperature. Oxide thermoelectric materials that are harmless, heat resistant, and inexpensive have been studied recently. These materials can be formed as bulk compacts by baking at a high temperature (for example, baking at 1,300° C. or higher). For example, the article by Michitaka Ohtaki et al., *J. Appl. Phys.*, 79(3), pp. 1816-1818 (1996) describes a bulk sintered compact of $Zn_{0.97}Al_{0.03}O$ and the thermoelectric properties of this material at room temperature and above.

SUMMARY OF THE INVENTION

A thermoelectric material based on a conventional bulk sintered compact typically requires baking at a high temperature during its production. Because the resulting thermoelectric material tends to be rigid, it is often not suitable for use as a power generation element for flexible and thin electric appliances such as electronic paper. Thermoelectric material that can be formed into a flexible and thin type material is desired.

According to one embodiment, the present disclosure provides a composite thermoelectric material that includes a binder resin, thermoelectric material particles dispersed in the binder resin, and fine metal particles supported on a surface of the thermoelectric material particles.

According to another embodiment, the present disclosure provides a method for producing a composite thermoelectric material. This method includes forming particles in which fine metal particles are supported on a surface of the thermoelectric material particles, and dispersing the resulting particles in a binder resin.

The composite thermoelectric material in the present disclosure can be formed into a flexible and thin type material while maintaining satisfactory thermoelectric properties.

DETAILED DESCRIPTION

Figure 1:
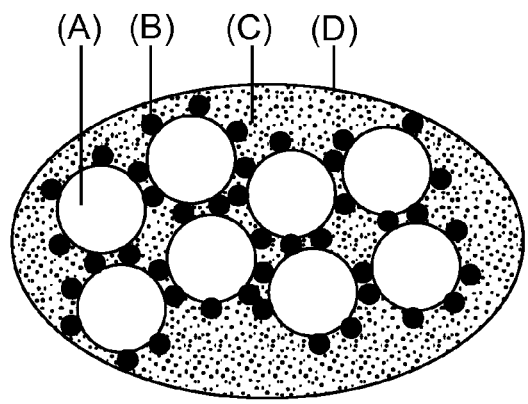
FIG. 1 is a schematic sectional view showing a thermoelectric material in the present disclosure. The letter A refers to thermoelectric material particles, the letter B refers to fine metal particles, the letter C refers to binder resin, and the letter D refers to composite thermoelectric material.

The present disclosure provides, in one aspect, a composite thermoelectric material comprising a binder resin, thermoelectric material particles dispersed in the binder resin, and fine metal particles supported on a surface of the thermoelectric material particles.

In such a composite thermoelectric material, since electric conductivity can be increased by forming a conducting path between thermoelectric material particles through supported fine metal particles while suppressing thermal conductivity, the performance characteristics can be improved. Usually, the performance characteristics of thermoelectric materials are represented by the following dimensionless performance index ZT:

$$ZT = S^2 \sigma T/\kappa \quad (1)$$

where S denotes a Seebeck coefficient (V/K), σ denotes conductivity (S/m), T denotes an absolute temperature (K), V denotes voltage, and κ denotes thermal conductivity (W/m/K).

The term "thermoelectric material" refers to a material that can generate thermoelectric power due to a temperature difference.

As thermoelectric material particles, for example, particles of powdered thermoelectric materials selected from ceramics and alloys can be used. Specifically, it is possible to select from tellurium compounds, silicon-germane-based compounds, silicide-based compounds, skutterudite compounds, whistler compounds, zinc antimonate compounds, boron compounds, cluster solids, oxides (for example, cobalt oxide-based compounds, zinc oxide-based compounds, titanium oxide-based compounds, layered perovskite-type oxides, and the like), clathrate compounds, and rare earth-based Kondo semiconductors.

In one embodiment, the average particle diameter of the thermoelectric material particles may be 10 nanometers (nm) or more, 100 nm or more, 1 micrometer (μm) or more, or 10 μm or more. The average particle diameters of the thermoelectric material particles may be 500 μm or less, 100 μm or less, or 50 μm or less. When the particle diameter of the thermoelectric material particles is too large, it becomes impossible to form a compact, for example, a flexible film when dispersed in a binder resin. In contrast, when the particle diameter of the thermoelectric material particles is too small, it becomes impossible to obtain sufficient contact between particles. The electric conductivity decreases and the ZT value cannot be increased.

In the present specification, the term "average particle diameter" of the thermoelectric material particles or fine metal particles is an average particle diameter obtained by randomly selecting 200 particles observed by a scanning electron microscope (SEM), measuring a particle diameter on a SEM photograph for each particle, and then determining the average of the particle diameters. When the particles to be measured do not have a circular shape or have an irregular shape other than the circular shape, the diameter of the major axis and that of the minor axis are measured. The average particle diameter is determined to be the average of the diameter of the major axis and diameter of the minor axis.

The fine metal particles are not particularly limited as long as they can be supported on the thermoelectric material particles to form a conducting path between particles. Noble metals such as palladium, silver, gold, platinum, rhodium and ruthenium can be used as the fine metal particles. In one embodiment, the average particle diameter of fine metal particles to be supported is usually 1 nm or more (e.g., 2 nm or more, 5 nm or more, or 10 nm or more). The average particle diameter of fine metal particles to be supported is usually 50 µm or less (e.g. 10 µm or less, 1 µm or less, 100 nm or less, or 50 nm or less).

When the particle diameter of the thermoelectric material particles is too small, sufficient contact between particles of the thermoelectric material on which the fine metal particles are supported is not attained. The electric conductivity of the composite thermoelectric material cannot be properly increased and ZT of the above equation (1) cannot be increased. In contrast, when the particle diameter of the thermoelectric material particles is too large, thermal conductivity of the composite thermoelectric material increases and thus ZT of the above equation (1) cannot be increased. The average particle diameter of the thermoelectric material particles is usually larger than that of the fine metal particles.

The content of the fine metal particles should be appropriately determined depending on the fine metal particles to be used, and is usually 10% by volume or less based on the volume of the thermoelectric material particles on which the fine metal particles are supported. When the volume of the fine metal particles is too large, the Seebeck coefficient of the resulting composite thermoelectric material decreases and also thermal conductivity increases. The value ZT decreases and the thermoelectric properties may deteriorate. In contrast, when the volume of the fine metal particles is too small, electric conductivity of the resulting composite thermoelectric material cannot be increased. The value ZT cannot be increased and the thermoelectric properties may not be improved. The content of the fine metal particles can be, for example, 0.1% by volume or more, 1% by volume or more, or 2% by volume or more, based on the volume of the thermoelectric material particles on which the fine metal particles are supported. The content of the fine metal particles can be, for example, 10% by volume or less, 5% by volume or less, 3% by volume or less, based on the volume of the thermoelectric material particles on which the fine metal particles are supported.

For example, when the fine metal particles are fine particles of palladium, the content is preferably from 0.5 to 5% by volume based on the volume of the thermoelectric material particles on which the fine metal particles are supported. When the fine metal particles are fine particles of silver, the content is preferably from 0.1 to 1% by volume based on the volume of the thermoelectric material particles on which the fine metal particles are supported. When the content is within the above range, electric conductivity can be properly increased while suppressing a decrease in the Seebeck coefficient of the composite thermoelectric material and an increase in thermal conductivity.

As described above, the average particle diameter of the thermoelectric material particles and that of the fine metal particles can exert an influence on thermoelectric properties of the resulting composite thermoelectric material. The ratio (i.e. d/D) of the average particle diameter (D) of the thermoelectric material particles to the average particle diameter (d) of the fine metal particles also can exert an influence on thermoelectric properties of the resulting composite thermoelectric material. The ratio d/D is not particularly limited but is usually $1/500$ or more (e.g., $1/200$ or more, $1/100$ or more, $1/50$ or more, or $1/20$ or more). Also, the ratio d/D is not particularly limited but is usually $1/2$ or less (e.g. $1/5$ or less or $1/10$ or less).

In one embodiment, the thermoelectric material particles on which the fine metal particles are supported can be produced by the following manner. The thermoelectric material particles are immersed in a solution of a salt such as chloride, acetate, acetylacetonate or nitrate of metal such as silver or palladium, thereby supporting metal ions such as silver or palladium ions on the thermoelectric material particles. Then, metal ions are reduced using a reducing agent, hydrogen or the like, or reduced by heat or light to form fine metal particles that are supported on the thermoelectric material particles. It is also possible to form the fine metal particles on the thermoelectric material particles by reducing the metal salt using an alcohol reduction method.

In another embodiment, thermoelectric material particles on which fine metal particles are supported can also be produced by adsorbing fine metal particles on thermoelectric material particles. For example, fine metal particles such as fine particles of silver are commercially available in a state of being coated with a pyrolytic protecting agent. These fine metal particles and thermoelectric material particles are added in a proper carrier such as toluene and the carrier is removed by evaporation, thereby adsorbing the fine metal particles on the thermoelectric material particles. Although the pyrolytic protecting agent may remain on the fine metal particles, it can be removed by heating to a pyrolysis temperature after mixing with a binder resin described hereinafter.

The composite thermoelectric material is obtained by dispersing thermoelectric material particles on which fine metal particles are supported in a binder resin. The binder resin imparts flexibility and integrity to the resulting composite thermoelectric material. The binder resin is not particularly limited as long as it enables dispersion of thermoelectric material particles on which fine metal particles are supported to form an integrated formed body. Various polymer resins can be used. For example, a thermoplastic resin or a curable resin can be used. Examples of the curable resin include thermocurable resins such as epoxy resins, phenol resins and unsaturated polyester resins; and photocurable resins such as polyacrylate and epoxy resins.

The amount of the binder resin is usually 5% by volume or more, e.g. 10% by volume or more, based on the total volume (i.e. the total volume of thermoelectric material particles on which fine metal particles are supported, and the binder resin) of the composite thermoelectric material. Also, the amount of the binder resin is usually 50% by volume or less, e.g. 30% by volume or less, based on the total volume (i.e. the total volume of thermoelectric material particles on which fine metal particles are supported, and the binder resin) of the composite thermoelectric material. When the amount of the binder resin is too small, the resulting formed body may become brittle. In contrast, when the amount of the binder resin is too large, it may become difficult to improve electric conductivity.

When curable resins are used, thermoelectric material particles on which fine metal particles are supported are uniformly mixed with the uncured portion of the resin and the mixture is cured to form a formed body. It is possible to use, as the thermoplastic resin, polymers known as the thermoplastic resin, such as polystyrene, polyethylene, polypropylene, polyacrylate, polyvinyl chloride, polyvinyl acetate, polyvinyl butyral, ethylene-vinyl acetate copolymer, polyallylate, polyethersulfone, polyetherimide and polycarbonate. When using a thermoplastic resin that is soluble in a solvent, the thermoplastic resin is mixed with thermoelectric material particles on which fine metal particles are supported in a solvent and the solvent is removed to obtain a formed body. A formed body can also be formed by hot pressing at a temperature of a glass transition temperature (Tg) or higher of the thermoplastic resin after removing the solvent. When using a thermoplastic resin which is not easily dissolved in a solvent, it may be mixed with thermoelectric material particles having supported metal particles using a kneader or extruder. A formed body can also be obtained by hot pressing described above.

Conventional thermoelectric materials such as metals, alloys, oxides and the like are often hard as bulk materials and have no flexibility. However, if a layer of the thermoelectric material is formed in the form of a thin film on a flexible base film, it becomes possible to handle as a somewhat flexible film together with a base film. However, it is often impossible to handle a thin film of a thermoelectric material as a self-standing film itself in the absence of a base film. In contrast, the composite thermoelectric material provided in the present disclosure can be handled as a self-standing film by itself and can have improved handling properties when compared with the above thermoelectric material in the form of a thin film.

When a thermoelectric power generation element is formed from the composite thermoelectric material produced as described above, power generation can be performed from a difference in a temperature. Since performances of a thermoelectric material reported at present do not enable large electric power generation, the thermoelectric material can be applied as a power supply of electric appliances that can be operated even by a small electric power. For example, the thermoelectric material can be used to provide power for electronic papers, radio frequency identification (RFID) applications, and clocks. Since electric power generation varies with a small change in a temperature, the thermoelectric material can also be used in various sensors utilizing a change in electric power generation. Furthermore, if a high-performance thermoelectric material is developed, a flexible thermoelectric element can be obtained by using the method of the present invention and therefore its wide application can be expected. It becomes possible to apply for not only a thermoelectric power generation element, but also a Peltier cooling element utilizing the Peltier effect.

EXAMPLES

Examples 1 to 3 and Comparative Example 1

Zinc oxide particles doped with aluminum (average particle diameter: 200 nm, $Zn_{0.98}Al_{0.02}O$ manufactured by Hakusuitech Ltd. under the trade name of 23K) were obtained. All of "zinc oxide particles" described in the following examples and comparative examples are the same zinc oxide particles, i.e., zinc oxide particles doped with aluminum (trade name 23K). Zinc oxide particles and palladium(II) acetylacetonate (manufactured by Aldrich Co.) were placed in a recovery flask in the palladium content (% by volume) shown in Table 1. Guaranteed ethanol (50 ml) was added thereto and, after drying with stirring using an evaporator, palladium (II) acetylacetonate was adsorbed on the zinc oxide particles. Next, particles adhered to the inside of the recovery flask were collected and placed in a separable flask, followed by replacement with nitrogen for about 20 minutes. Subsequently, the particles were reduced with heat by immersing the separable flask in an oil bath at 185° C. while performing $N_2$ flow to form zinc oxide (ZnO) particles supporting palladium (Pd) fine metal particles. After 2 hours, the separable flask was taken out from the oil bath and the temperature was returned to room temperature by natural cooling. A powder was collected that contained zinc oxide particles supporting palladium fine metal particles.

The above powder and a solution (10% by weight) of polyvinyl butyral (made by Wako Pure Chemical Industries, Ltd.: average polymerization degree of about 900-1000) (the same polyvinyl butyral was also used in the following Examples and Comparative Examples) in isopropyl alcohol (IPA) were mixed with stirring. The volume ratio of the powder to polyvinyl butyral binder resin was 90:10. The mixture was then dried at room temperature to obtain a composite thermoelectric material in which zinc oxide (ZnO) particles supporting palladium (Pd) fine metal particles are dispersed in a polyvinyl butyral binder resin. In Comparative Example 1, zinc oxide particles, which were not subjected to a treatment of supporting palladium (Pd) fine metal particles, were used.

The volume % of palladium metal was calculated by using a density of palladium fine metal particles of 12.02 $g/cm^3$ and a density of zinc oxide particles of 5.68 $g/cm^3$. A volume ratio of the powder to the polyvinyl butyral binder resin was calculated by using a density of polyvinyl butyral of 1.06 $g/cm^3$. The same shall density values were used in the following Examples and Comparative Examples.

Next, press forming the composite material was carried out by pressing in one direction at 120° C. for 3 minutes under applied pressure of 1 GPa. Upon pressing, in order to suppress spreading of a sample in the direction vertical to the applied pressure, a frame obtained by hollowing out the center portion measuring 10 mm×10 mm of a 2.2 mm of a silicon rubber sheet was used. Between a press plate and the sample, a glass plate having peelability improved by a fluorine-based surface treating agent was disposed to obtain satisfactory releasability from the sample after pressing.

Examples 4 to 5 and Comparative Example 2

In the same manner as in Examples 1 to 3, except that, using palladium (II) acetylacetonate (manufactured by Aldrich Co.) in the palladium content (% by volume) shown in Table 2, a powder of zinc oxide (ZnO) particles supporting palladium (Pd) fine metal particles and a polyvinyl butyral binder resin were mixed in a ratio of 80:20 in terms a volume ratio, samples of composite thermoelectric materials were obtained. In Comparative Example 2, zinc oxide particles, which were not subjected to a treatment of supporting palladium (Pd) fine metal particles, were used.

Examples 6 to 7 and Comparative Example 3

In the same manner as in Examples 1 to 3, except that, using palladium (II) acetylacetonate (manufactured by Aldrich Co.) in the palladium content (% by volume) shown in Table 3, a powder of zinc oxide (ZnO) particles supporting palladium (Pd) fine metal particles and a polyvinyl butyral binder resin were mixed in a ratio of 70:30 in terms a volume ratio, samples of composite thermoelectric materials were obtained. In Comparative Example 3, zinc oxide particles, which were not subjected to a treatment of supporting palladium (Pd) fine metal particles, were used.

Comparative Examples 4 to 7

In the same manner as in Examples 1 to 3, except that, using palladium(II) acetylacetonate (manufactured by Aldrich Co.)

in the palladium content (% by volume) shown in Table 3 and using no polyvinyl butyral binder resin, only a powder of zinc oxide (ZnO) particles supporting palladium (Pd) fine metal particles were dispersed in isopropyl alcohol (IPA), samples were obtained. In Comparative Example 4, zinc oxide particles, which were not subjected to a treatment of supporting palladium (Pd) fine metal particles, were used.

Evaluation of Samples

Figure 4:
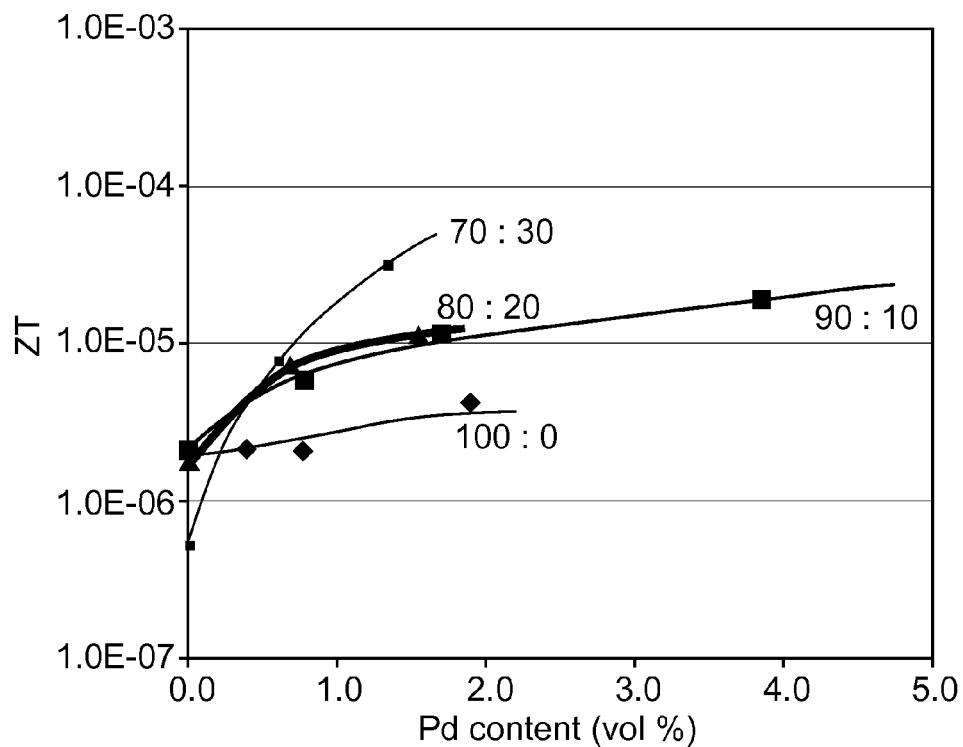
FIG. 4 is a graph showing a relation between the content of fine palladium particles and the dimensionless performance characteristic ZT.
Figure 5:
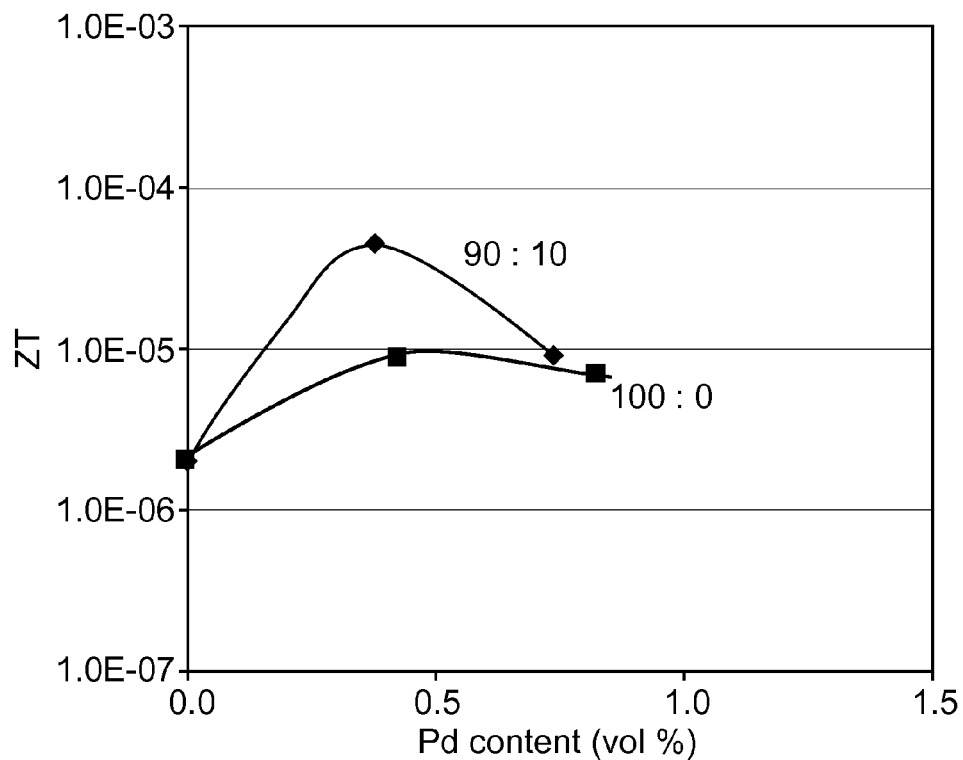
FIG. 5 is a graph showing a relation between the content of fine silver particles and the dimensionless performance characteristic ZT.

Density was calculated by measuring the mass, thickness and size of the resulting samples. Furthermore, electric conductivity ($\sigma$) was calculated by measuring voltage (V)/current (I) at room temperature (25° C.) using a four-probe measuring method. Furthermore, a Seebeck coefficient (S) was calculated by measuring a thermoelectromotive force, thereby determining an output factor P ($P=S^2\sigma$). Furthermore, thermal conductivity ($\kappa$) was determined by calculating a specific heat by measurement of thermal diffusivity and a composition ratio. Based on these measurement results, a dimensionless performance index ZT at an operating temperature of 300K was determined by the above equation (1). The results are shown in Table 1 to 4 and FIG. 4. For evaluation of the thermoelectric properties, if a sample to be evaluated which is a mixture of thermoelectric material particles supporting fine metal particles with a binder resin has ZT value higher than the standard value, which is the ZT value of a mixture of the thermoelectric material particles without supporting fine metal particles with the binder resin, it is rated as "good". Film-forming properties were also evaluated and rated as "Good" or "Poor". "Good" means that samples have flexibility and can be handled as an independent foil, whereas, "Poor" means that samples are too poor in flexibility and brittle to be handled as an independent foil.

Figure 2:
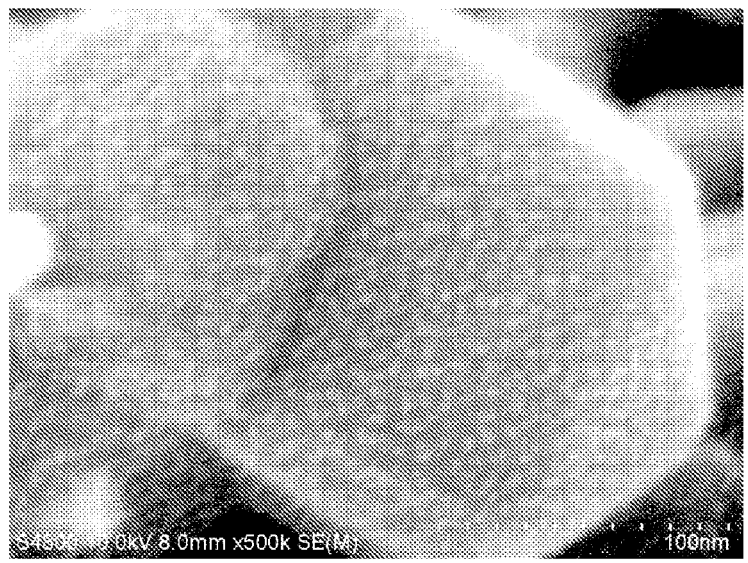
FIG. 2 is a field emission scanning electron microscope (FE-SEM) photograph of zinc oxide particles supporting fine palladium particles prepared in Example 1, the photograph being substituted for a drawing.
Figure 3:
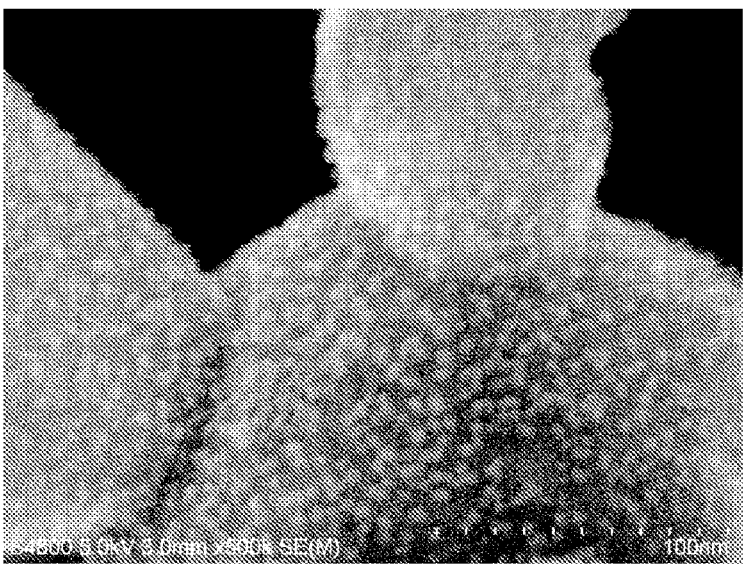
FIG. 3 is a field emission scanning electron microscope (FE-SEM) photograph of zinc oxide particles supporting fine palladium particles prepared in Example 3, the photograph being substituted for a drawing.

Field emission scanning electron microscope (FE-SEM) photographs of powders produced in Examples 1 and 3 are shown in FIGS. 2 and 3 and it was observed that fine palladium particles are supported on a surface of zinc oxide particles. 200 fine metal particles were selected at random from the photographs of FIGS. 2 and 3 and the particle diameter was measured on the SEM photographs as described above and then the average of particle diameters of 200 particles was determined. As a result, the average particle diameters of palladium fine metal particles were respectively 4.10 nm (standard deviation: 1.19 nm) and 4.24 nm (standard deviation: 0.99 nm). Also, a composite thermoelectric material could be produced at the temperature (120° C.) which is lower than the baking temperature (1,300° C.) at which a conventional bulk compact is obtained.

TABLE 1

Pd:AlZnO:PVB = 90:10

| Example No. | Pd (vol %) | $\delta$ (S/cm) | S ($\mu$V/K) | P ($\mu$W/m/K$^2$) | $\kappa$ | ZT | Thermoelectric properties | Film-forming properties |
|---|---|---|---|---|---|---|---|---|
| Comparative Example 1 | 0.00 | 0.0455 | −66.9 | 0.0204 | 2.93E+00 | 2.09E−06 | — | Good |
| Example 1 | 0.77 | 0.1309 | −63.8 | 0.0531 | 2.74E+00 | 5.83E−06 | Good | Good |
| Example 2 | 1.70 | 0.4820 | −59.6 | 0.1712 | 4.59E+00 | 1.12E−05 | Good | Good |
| Example 3 | 3.84 | 0.7680 | −45.0 | 0.1555 | 2.55E+00 | 1.83E−05 | Good | Good |

TABLE 2

Pd:AlZnO:PVB = 80:20

| Example No. | Pd (vol %) | $\delta$ (S/cm) | S ($\mu$V/K) | P ($\mu$W/m/K$^2$) | $\kappa$ | ZT | Thermoelectric properties | Film-forming properties |
|---|---|---|---|---|---|---|---|---|
| Comparative Example 2 | 0.00 | 0.0417 | −73.1 | 0.0223 | 3.71E+00 | 1.80E−06 | — | Good |
| Example 4 | 0.69 | 0.2037 | −64.5 | 0.0847 | 3.57E+00 | 7.11E−06 | Good | Good |
| Example 5 | 1.54 | 0.2899 | −63.2 | 0.1159 | 3.01E+00 | 1.16E−05 | Good | Good |

TABLE 3

Pd:AlZnO:PVB = 70:30

| Example No. | Pd (vol %) | $\delta$ (S/cm) | S ($\mu$V/K) | P ($\mu$W/m/K$^2$) | $\kappa$ | ZT | Thermoelectric properties | Film-forming properties |
|---|---|---|---|---|---|---|---|---|
| Comparative Example 3 | 0.00 | 0.0175 | −71.0 | 0.0088 | 5.10E+00 | 5.19E−07 | — | Good |
| Example 6 | 0.60 | 0.2255 | −67.6 | 0.1032 | 4.00E+00 | 7.74E−06 | Good | Good |
| Example 7 | 1.35 | 0.8331 | −61.5 | 0.3155 | 3.02E+00 | 3.13E−05 | Good | Good |

TABLE 4

Pd:AlZnO:PVB = 100:0

| Example No. | Pd (vol %) | $\delta$ (S/cm) | S ($\mu$V/K) | P ($\mu$W/m/K$^2$) | $\kappa$ | ZT | Thermoelectric properties | Film-forming properties |
|---|---|---|---|---|---|---|---|---|
| Comparative Example 4 | 0.00 | 0.0622 | −66.4 | 0.0274 | 4.06E+00 | 2.03E−06 | — | Poor |
| Comparative Example 5 | 0.39 | 0.066 | −67.2 | 0.0298 | 4.15E+00 | 2.16E−06 | Good | Poor |
| Comparative Example 6 | 0.77 | 0.0692 | −59.5 | 0.0245 | 3.53E+00 | 2.08E−06 | Good | Poor |
| Comparative Example 7 | 1.89 | 0.109 | −63.7 | 0.0442 | 3.24E+00 | 4.09E−06 | Good | Poor |

Examples 8 to 9 and Comparative Example 8

Zinc oxide particles doped with aluminum (average particle diameter 200 nm, $Zn_{0.98}Al_{0.02}O$ manufactured by Hakusuitech Ltd. under the trade name of 23K) were prepared.

Next, a powder composed of silver nanoparticles coated with a pyrolytic protecting agent (silver nanoparticle precursor manufactured by Mitsuboshi Belting Ltd.) (Mdot-SS) (particle diameter (containing no protecting agent) of silver is from 3 to 5 nm) and 23K were placed in a recovery flask in the silver content (% by volume) shown in Table 5. 100 ml of guaranteed ethanol was added thereto and Mdot-SS was dissolved by supersonic vibration and, after drying with stirring using an evaporator, Mdot-SS was adsorbed on particles of 23K and a powder of the resulting fine particles was collected. The volume % of silver metal is calculated using the density of noble fine metal particles of 10.49 g/cm$^3$ and the density of zinc oxide particles of 5.68 g/cm$^3$.

The above powder and a solution (1% by weight) of polyvinyl butyral in isopropyl alcohol (IPA) were mixed in a ratio of a powder and a polyvinyl butyral binder resin of 90:10 in terms of a volume ratio and then stirred by a hybrid mixer for 10 minutes while including cooling with ice water every 5 minutes. After the solution was sufficiently cooled, the solution was transferred to a recovery flask and then IPA was evaporated by an evaporator to obtain a composite in which the powder is dispersed in PVB. The resulting composite was ground in an agate mortar and the finely ground composite was collected. The volume ratio of the powder to the polyvinyl butyral binder resin is calculated by using the density of polyvinyl butyral of 1.06 g/cm$^3$.

Next, press forming was carried out by pressing in one direction at 120° C. for 30 minutes under applied pressure of 1 GPa. Upon pressing, in order to suppress spreading of a sample in the direction vertical to the applied pressure, a frame obtained by hollowing out the center portion measuring 10 mm×10 mm of a 2.2 mm thick silicon rubber sheet was used. Between a press plate of a sample and the sample, a glass plate having peelability improved by a fluorine-based surface treating agent was disposed to obtain satisfactory releasability from the sample after pressing. By hot pressing, the protecting agent of Mdot-SS were thermally decomposed into fine silver particles containing no protecting agent, thus obtaining particles in which fine silver particles are supported on a surface of particles of 23K. Since the hot pressing temperature of 200° C. is sufficiently higher than the glass transition temperature of polyvinyl butyral, the polyvinyl butyral resin becomes flowable and particles pushed the polyvinyl butyral resin aside by the press pressure, and thus adjacent particles are connected via fine silver particles.

Comparative Examples 9 to 11

In the same manner as in Examples 8 to 9, except that, using Mdot-SS in the silver content (% by volume) shown in Table 6 and using no polyvinyl butyral binder resin, only a powder of zinc oxide (ZnO) particles supporting palladium (Pd) fine metal particles were dispersed in isopropyl alcohol (IPA), samples were obtained. In Comparative Example 9, zinc oxide particles, which were not subjected to a treatment of supporting silver (Ag) fine metal particles, were used.

Evaluation of Samples

In the same manner as in the above-described Examples and Comparative Examples in which zinc oxide (ZnO) particles supporting palladium (Pd) fine metal particles are used, samples were evaluated. The results are shown in Tables 5 to 6.

TABLE 5

Ag:AlZnO:PVB = 90:10

| Example No. | Pd (vol %) | $\delta$ (S/cm) | S ($\mu$V/K) | P ($\mu$W/m/K$^2$) | $\kappa$ | ZT | Thermoelectric properties | Film-forming properties |
|---|---|---|---|---|---|---|---|---|
| Comparative Example 8 | 0.00 | 0.0455 | −66.9 | 0.0204 | 2.93E+00 | 2.09E−06 | — | Good |
| Example 8 | 0.38 | 1.90 | −61 | 0.7070 | 4.68E+00 | 4.53E−05 | Good | Good |
| Example 9 | 0.74 | 0.54 | −63 | 0.2143 | 6.93E+00 | 9.28E−06 | Good | Good |

TABLE 6

Ag:AlZnO:PVB = 100:0

| Example No. | Pd (vol %) | δ (S/cm) | S (μV/K) | P (μW/m/K$^2$) | κ | ZT | Thermoelectric properties | Film-forming properties |
|---|---|---|---|---|---|---|---|---|
| Comparative Example 9 | 0.00 | 0.0622 | −66.4 | 0.0274 | 4.06E+00 | 2.03E−06 | — | Poor |
| Comparative Example 10 | 0.42 | 0.29 | −61 | 0.1079 | 3.66E+00 | 8.86E−06 | Good | Poor |
| Comparative Example 11 | 0.83 | 0.27 | −55 | 0.0817 | 3.41E+00 | 7.18E−06 | Good | Poor |

Examples 10 to 11 and Comparative Example 12

In the same manner as in Examples 1 to 3, except that particles of bithmuth selenide (particle diameter is not clear, $Bi_2Se_3$ manufactured by Kojundo Chemical Lab. Co., Ltd.) were used as a thermoelectric material in place of zinc oxide particles doped with aluminum (average particle diameter 200 nm, $Zn_{0.98}Al_{0.02}O$ manufactured by Hakusuitech Ltd. under the trade name of 23K) and palladium(II) acetylacetonate (manufactured by Aldrich Co.) was used in the palladium content (% by volume) shown in Table 7, composite thermoelectric materials were produced and then evaluated. In Comparative Example 12, particles of bithmuth selenide, which were not subjected to a treatment for supporting palladium (Pd) fine metal particles, were used. The results are shown in Table 7. The volume % of palladium metal is calculated by using the density of palladium fine metal particles of 12.02 g/cm$^3$ and the density of bithmuth selenide particles of 7.68 g/cm$^3$.

TABLE 7

Pd:Bi$_2$Se$_3$:PVB = 90:10

| Example No. | Pd (vol %) | δ (S/cm) | S (μV/K) | P (μW/m/K$^2$) | κ | ZT | Thermoelectric properties | Film-forming properties |
|---|---|---|---|---|---|---|---|---|
| Comparative Example 12 | 0 | 68.6 | −67.7 | 31.44 | 5.55 | 1.70E−03 | — | Good |
| Example 10 | 0.35 | 78.2 | −65.1 | 33.14 | 5.17 | 1.92E−03 | Good | Good |
| Example 11 | 0.87 | 64.8 | −70.8 | 32.48 | 4.67 | 2.09E−03 | Good | Good |

INDUSTRIAL APPLICABILITY

The composite thermoelectric material of the present disclosure can be applied as a power supply of electric appliances such as electronic paper, radio frequency identification (RFID) and clock by forming into a thermoelectric power generation element. It can also be applied for various sensors utilizing the fact that electric power generation varies with small change in a temperature. If a high-performance thermoelectric material is developed, a flexible thermoelectric element can be obtained by using the method of the present disclosure and therefore wide application can be expected. Application is possible not only as a thermoelectric power generation element, but also as a Peltier cooling element utilizing the Peltier effect.

We claim:

1. A composite thermoelectric material comprising:
    a binder resin,
    thermoelectric material particles dispersed in the binder resin, and
    fine metal particles supported on a surface of the thermoelectric material particles.

2. The composite thermoelectric material according to claim 1, wherein the thermoelectric material particles have an average particle diameter of 10 nm to 500 μm and the fine metal particles have an average particle diameter of 1 nm to 50 μm, and the average particle diameter of the thermoelectric material particles is larger than that of the fine metal particles.

3. The composite thermoelectric material according to claim 2, wherein a ratio (d/D) of an average particle diameter (d) of the fine metal particles to an average particle diameter (D) of the thermoelectric material particles is from 1/500 to 1/2.

4. The composite thermoelectric material according to claim 1, wherein the thermoelectric material particles contain metal or metal oxide.

5. The composite thermoelectric material according to claim 1, wherein the fine metal particles are fine particles of noble metal.

6. The composite thermoelectric material according to claim 5, wherein the noble metal is palladium, silver, gold, platinum, rhodium or ruthenium.

7. The composite thermoelectric material according to claim 1, which contains the fine metal particles in the amount of 10% by volume or less based on the total volume of the thermoelectric material particles and the fine metal particles.

8. The composite thermoelectric material according to claim 7, wherein the fine metal particles are fine particles of palladium and the content of the fine metal particles is from 0.5 to 5% by volume based on the total volume of the thermoelectric material particles and the fine metal particles.

9. The composite thermoelectric material according to claim 7, wherein the fine metal particles are fine particles of silver and the content of the fine metal particles is from 0.1 to 1% by volume based on the total volume of the thermoelectric material particles and the fine metal particles.

10. A method for producing a composite thermoelectric material, which comprises:
    forming particles in which fine metal particles are supported on a surface of the thermoelectric material particles, and
    dispersing the resulting particles in a binder resin.

11. The method for producing a composite thermoelectric material according to claim 10, which comprises:

introducing thermoelectric material particles into a solution of a metal salt, thereby uniformly dispersing the particles, and reducing the metal salt, thereby depositing fine metal particles on the particles.

12. The method for producing a composite thermoelectric material according to claim 10, which includes adding particles comprising thermoelectric material particles and fine metal particles supported on a surface of the thermoelectric material particles into a solution of a binder resin in a solvent, and removing the solvent.

* * * * *